United States Patent [19]
Poole et al.

[11] Patent Number: 5,134,274
[45] Date of Patent: Jul. 28, 1992

[54] TWO-SIDED SOLID-STATE IMAGING DEVICE

[75] Inventors: Richard R. Poole, Norwalk; Enrique Garcia, Sandy Hook, both of Conn.

[73] Assignee: Hughes Aircraft Company, Los Angeles, Calif.

[21] Appl. No.: 670,840

[22] Filed: Mar. 18, 1991

[51] Int. Cl.[5] .............................................. H01J 40/14
[52] U.S. Cl. ............................... 250/208.1; 250/211 R
[58] Field of Search ............ 250/208.1, 211 R, 211 J; 358/213.13; 357/30 D

[56] References Cited

U.S. PATENT DOCUMENTS 4,908,718 3/1990 Shimada ........................... 250/208.1
4,931,661 6/1990 Fukaya et al. .................... 250/208.1

*Primary Examiner*—David C. Nelms
*Assistant Examiner*—K. Shami
*Attorney, Agent, or Firm*—W. K. Denson-Low; W. J. Streeter; R. A. Hays

[57] ABSTRACT

A charge-coupled imaging device (FIG. 3) is thinned to allow for backside illumination. The device is further enhanced using ion implantation techniques to establish an electrical field (44) at the back surface, which functions to drive free electrons to potential wells generated beneath a gate structure (40) on the front surface. The device structure allows for both front side and backside illumination and is useful as an imaging device in applications where it is necessary to combine images from two different optical sources. The imaging device is particularly useful in terrestrial guidance systems (FIG. 5) where the imaging device is used to detect guide stars from a large guide star field. In such systems, the imaging device must be translated within an X-Y plane in order to cover the entire guide star field. In order to accurately know the position of the imaging device, optical fiducial marks are imaged onto a side of the imaging device opposite the side receiving the guide star photons. Using the two-sided imaging device allows for the elimination of optical elements necessary for combining the optical signals, particular the use of beam splitters.

6 Claims, 4 Drawing Sheets

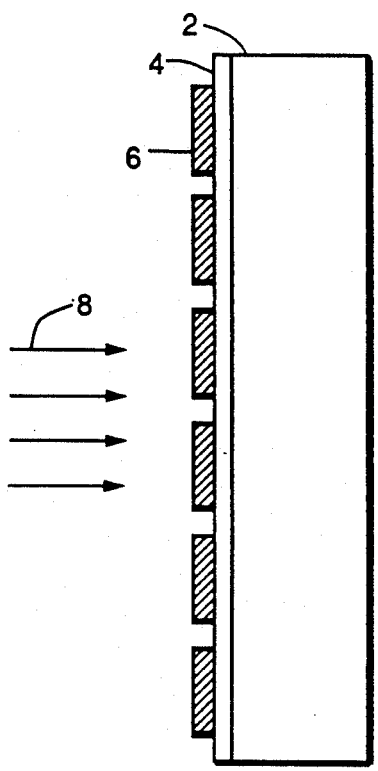
FIG.1a.
(PRIOR ART)
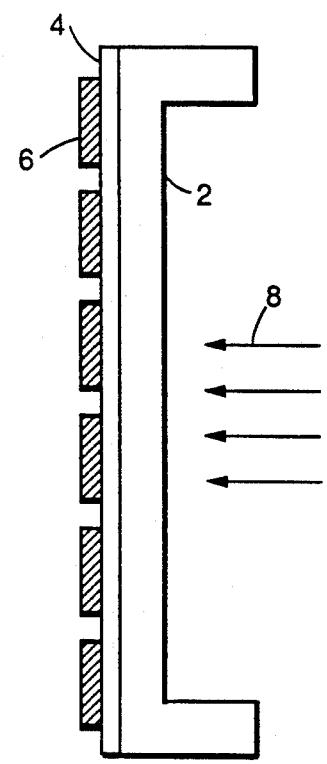
FIG. 1b.
(PRIOR ART)
FIG.3.
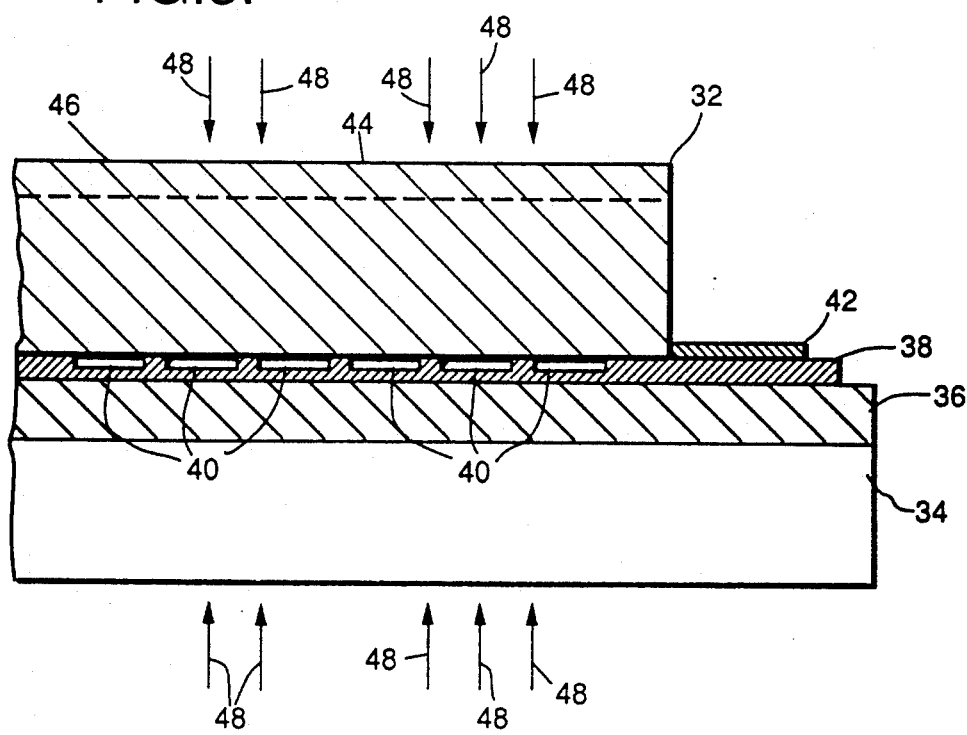

TWO-SIDED SOLID-STATE IMAGING DEVICE

BACKGROUND OF THE INVENTION

1. Field of the Invention

The present invention relates to solid-state imaging devices and more particularly, to a thinned charge-coupled imaging device in which both the front and back surfaces can be used simultaneously for image sensing.

2. Description of the Prior Art

Charge-coupled devices are typically made of silicon and are used as solid-state imagers by taking advantage of the properties of a silicon crystal lattice. In the crystalline form, each atom of silicon is covalently bonded to its neighbor. Energy greater than the energy gap of about 1.1 V is required to break a bond and create an electron hole pair. Incident electromagnetic radiation in the form of photons of wavelength shorter than 1 um can break the bonds and generate electron hole pairs.

The wavelength of incoming light and the photon absorption depth are directly related, the shorter the wavelength, the shorter the penetration depth into the silicon. Silicon becomes transparent at a wavelength of approximately 1100 nm and is essentially opaque to light at wavelengths shorter than 400 nm. High energy particles, X-rays and cosmic rays can break many thousands of bonds; therefore, excessive exposure can cause damage to the crystal lattice. Bonds can also be broken by thermal agitation. At room temperature, approximately 50 bonds per second per $um^3$ are broken and recombined on a continuous basis. The rate of electron hole pair generation due to thermal energy is highly temperature-dependent and can be reduced arbitrarily through cooling.

In order to measure the electronic charge produced by incident photons, it was required to provide a means for collecting this charge. Thus, the potential well concept was developed, wherein a thin layer of silicon dioxide is grown on a section of silicon, and a conductive gate structure is applied over the oxide. The gate structure is formed in an array of columns and rows, thus making it possible by applying a positive electrical potential to various gate elements to create depletion regions where free electrons generated by the incoming photons can be stored.

By controlling the electrical potential applied to adjacent gates, the depletion region, or well, containing the free electrons can be caused to migrate along a column or row, so that the signal may eventually be output at the edge of the array.

Typically, the gate structure is arranged with multiple phases, particularly three phases, so that the potential wells may be easily migrated through the silicon to an output device.

In reality, the wells and the migration of the wells is not carried out along the surface of the silicon-silicon dioxide interface, but takes place in a buried channel below the surface. The buried channel is free of interference from interface states and thus assures effective charge transfer from well to well. The operation of a charge-coupled device is somewhat analogous to that of a bucket brigade circuit commonly used to delay electrical signals.

Because the charge from the wells located far from an output amplifier must undergo hundreds of transfers, the charge transfer efficiency of a charge-coupled device is most important, as is the quantum efficiency and the spectral response. These considerations are particularly important when extremely low light levels are to be sensed.

Light normally enters the charge-coupled device by passing through the gates in the silicon dioxide layer. The gates are usually made of very thin polysilicon, which is reasonably transparent to long wavelengths but becomes opaque at wavelengths shorter than 400 nm. Thus, at short wavelengths, the gate structure attenuates incoming light.

In an effort to overcome this difficulty, it has become the practice to uniformly thin a charge-coupled device to a thickness of approximately 10 um. Using a thinned charge-coupled device, it then becomes possible to focus an image on the backside of the charge-coupled device, where there is no gate structure that will attenuate the incoming light. Thinned charge-coupled devices exhibit high sensitivity to light from the soft X-ray to the near-infrared region of the spectrum.

FIG. 1A illustrates schematically a cross-section of a typical thick-bodied charge-coupled device. The device includes a silicon body 2, a silicon dioxide layer 4 and a gate array 6 formed on the silicon dioxide layer. Incoming light is illustrated by arrows 8 as illuminating a front side of the silicon 2. FIG. 1B illustrates a cross-section of a thinned charge-coupled device with light illuminating a backside. The thinned charge-coupled device, having a thickness of approximately 10 um, has improved quantum efficiency and UV spectral response.

In advanced optical systems, there are instances when it is required that two images originating from separate optical sources be precisely registered onto the surface of an image sensor. Using conventional charge-coupled solid-state image sensors, the requirements are achieved using beam splitters and associated optical elements to properly combine the two optical images into a single path for projection onto a surface of an image sensor. Use of these optical elements is rather conventional; however, it requires precise alignment of the components and inherently introduces unavoidable optical losses as the light passes through the optical elements.

There are numerous applications for solid-state image sensors, wherein the light to be sensed is very dim or does not have a sharp contrast with background light; and in such cases, optical losses are critical. One example of such application is in guidance systems for space vehicles which utilize terrestrial positioning.

In such applications an image sensor, and in particular a large charge-coupled imaging device array, is used to detect and precisely determine the position of guide stars relative to the vehicle's orientation. The field of possible guide stars is vast, and it would be impossible for a charge-coupled imaging device to be large enough to cover the entire field. Thus, it has become the practice to position the imaging device in an X-Y plane in order to cover the entire field of guide stars. When a positionable imaging device is utilized, it is necessary that the position of the imaging device relative to vehicle axis be precisely tracked.

Conventional ways for determining the imaging device's position rely on either precision mechanical encoders or on optical fiducial marks imaged onto the imaging device array via beam splitters. Given the required precision, the former mechanical method leads to complex solutions, and the latter optical method is wasteful of guide star photons, due to the beam splitter and other image-combining optics.

Referring to FIG. 2, there is shown schematically a prior art system used to orient a space vehicle relative to a guide star field. The heart of the system comprises a charge-coupled imaging device 10 of the standard single-sided construction. Said device is mounted to a movable stage 12 constructed to locate the device 10 in desired positions in an X-Y plane under the control of a stage control 14. A module 16 is provided for processing electrical signals coming from the imaging device.

Terrestrial light or photons from guide stars are collected by a telescope and are directed towards a mirror 18 to be focused onto an aspherical collimator 20 which, in conjunction with an imaging lens 22, directs the guide star photons onto a surface of the imaging device 10. As can be seen from FIG. 2, the photons pass through a beam combiner 24. An illumination driver 26 controls a pinhole grid plate 28 which establishes an array of fiducial reference points which are fixed in position relative to the main telescope axis. The light from the pinhole grid plate 28 is focused by a light grid lens 30 onto the beam combiner 24, where the light images from the grid 28 are combined with the photons from the guide stars and are focused onto the imaging device 10. Based on the location of the fiducial reference points, the signal process electronics module 16 may determine precisely the position of the imaging device in the X-Y plane.

With this configuration, the beam splitter and combiner 24 has the unavoidable effect of diverting a portion of the guide star light away from the imaging device, with a resultant loss of photons and a reduction in the signal-to-noise ratio. Any fluctuations in the position of the pinhole grid plate, light grid lens, beam combiner or the imaging lens results in apparent guide star position error.

SUMMARY OF THE INVENTION

The present invention contemplates a two-sided imaging device in the form of a thinned charge-coupled imaging device, wherein the light to be imaged may be received from both the front and back sides of the device. Such a device offers distinct advantages over the use of conventional single-sided imaging devices, particularly in applications where it is necessary to combine images from two different optical paths. Using a two-sided imaging device results in a much simpler, more rugged, more compact and more optically efficient system than that of the prior art. The use of complicated optical arrangements which resulted in photon loss and potential misalignment is essentially eliminated, since the image sensor of the present invention is inherently aligned and registered relative to the two images of interest.

In terrestrial guidance systems, the guide star photons may be provided directly to one side of the imaging device, while the optical fiducial marks may be imaged directly onto the other side of the imaging device.

A primary objective of the present invention is to provide a solid-state image sensor formed of a thinned charge-coupled imaging device having both front and back surfaces which can receive light to be imaged.

Another objective of the present invention is to provide an apparatus which more efficiently combines images from two different optical sources.

Another objective of the present invention is to provide an improved, more optically-efficient terrestrial guidance system.

DESCRIPTION OF THE DRAWINGS

FIGS. 1A and 1B are cross-section illustrations of thick and thinned charge-coupled devices, respectively.

FIG. 3 is a partial section schematically illustrating the two-sided solid-state imaging device of the present invention.

DETAILED DESCRIPTION OF THE INVENTION

Figure 2:
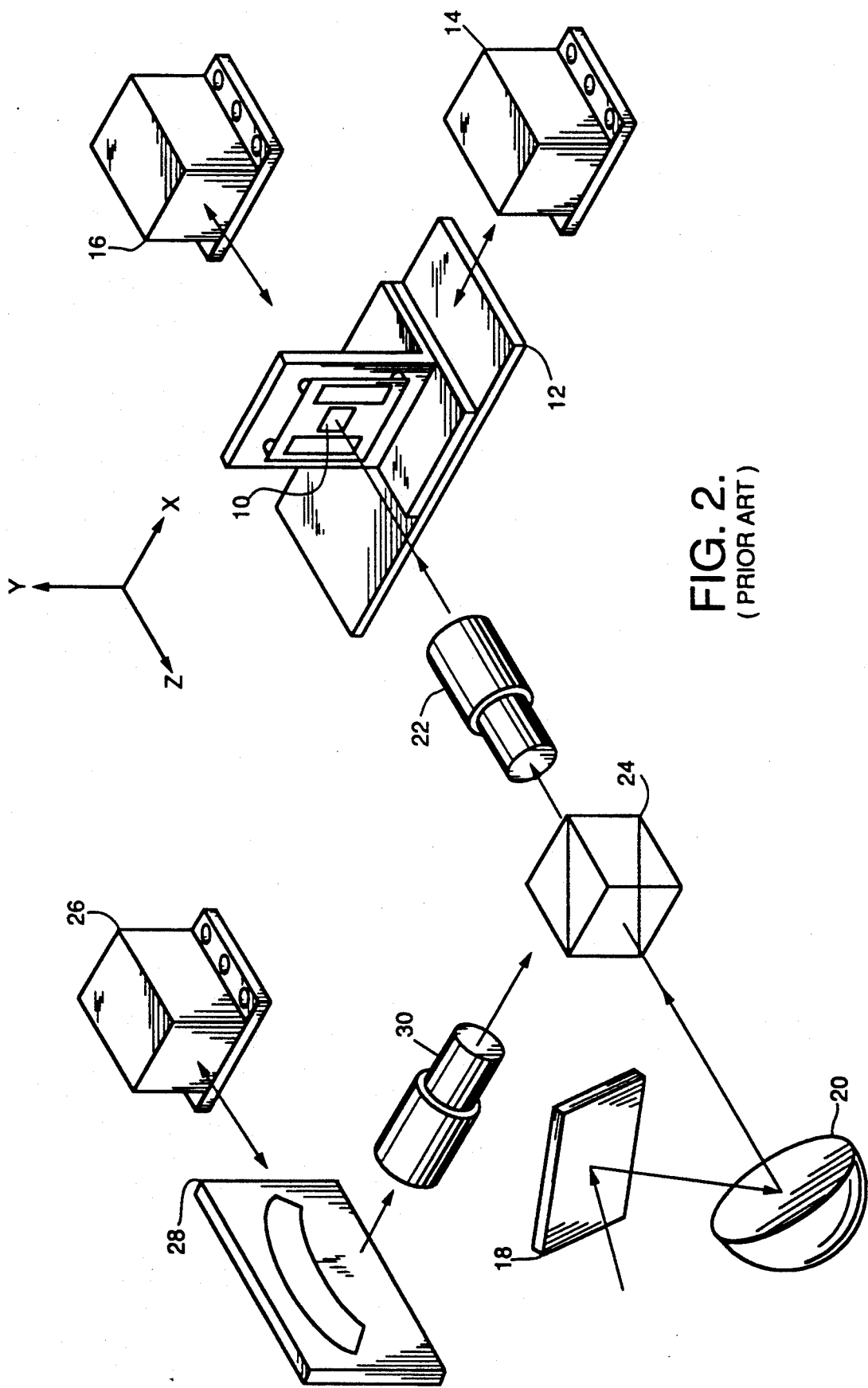
FIG. 2 is a schematic illustration of a prior art terrestrial guidance system.

The present invention contemplates a two-sided imaging device as shown in FIG. 3. The device is constructed of a thinned charge-coupled imaging device which may be illuminated from both the front and the rear surfaces. The device has a structure that includes a thinned silicon body 32, a glass substrate 34, an epoxy layer 36, a layer of silicon dioxide 38, a charge-coupled gate array 40, and exposed aluminum bonding pads 42. A region 44 contains implanted ions for establishing an electrical field at a rear surface 46. The ions are preferably boron and are at a concentration of $1 \times 10^{19}$ to $1 \times 10^{20}$ boron atoms per cubic centimeter. Light may be received at both sides of the imaging device as indicated by arrows 48.

An imaging device of this type may be constructed in a manner as described in the commonly assigned co-pending applications entitled "Thinned Charge-Coupled Devices and Method for Making the Same", Ser. No. 07/670,841, and "Method for Establishing an Electrical Field at a Surface of a Semiconductor Device", Ser. No. 07/670,672, both filed on even date herewith. Thinned charge-coupled imaging devices constructed in accordance with the afore-mentioned patent applications are thinned to approximately 10 um to thereby allow light to enter from the back surface as well as from the front surface. Both the front and back surfaces have optical quality surface smoothness to receive illumination without distortion. The device is constructed from a conventional one-sided imaging device, with silicon on the rear surface being removed to thin the device to a 10 um thickness using a combined lapping and polishing procedure, as described in the above-referenced application entitled "Thinned Charge-Coupled Devices and Method for Making the Same", which application is incorporated herein by reference. A thinned charge-coupled device constructed in accordance with the afore-mentioned application is further enhanced and its efficiency improved using an ion implantation technique, as described in the application entitled "Method for Establishing an Electrical Field at a Surface of a Semiconductor Device", which is also incorporated herein by reference. After construction of the imaging device as mentioned in the afore-mentioned applications, the device is mounted in a package which is open on both front and back surfaces to allow simultaneous front and back imaging.

The particular device selected for use in a terrestrial guidance system comprises a 1024 × 1024 pixel charge-coupled imaging device of conventional architecture fabricated by Ford Aerospace, now Loral, and sold under the nomenclature FA1024L Scientific Imager.

The imaging device was processed as previously discussed in accordance with the two patent applications incorporated herein by reference and mounted in a 48-pin package having a window opened in both its front and back surfaces.

Figure 4:
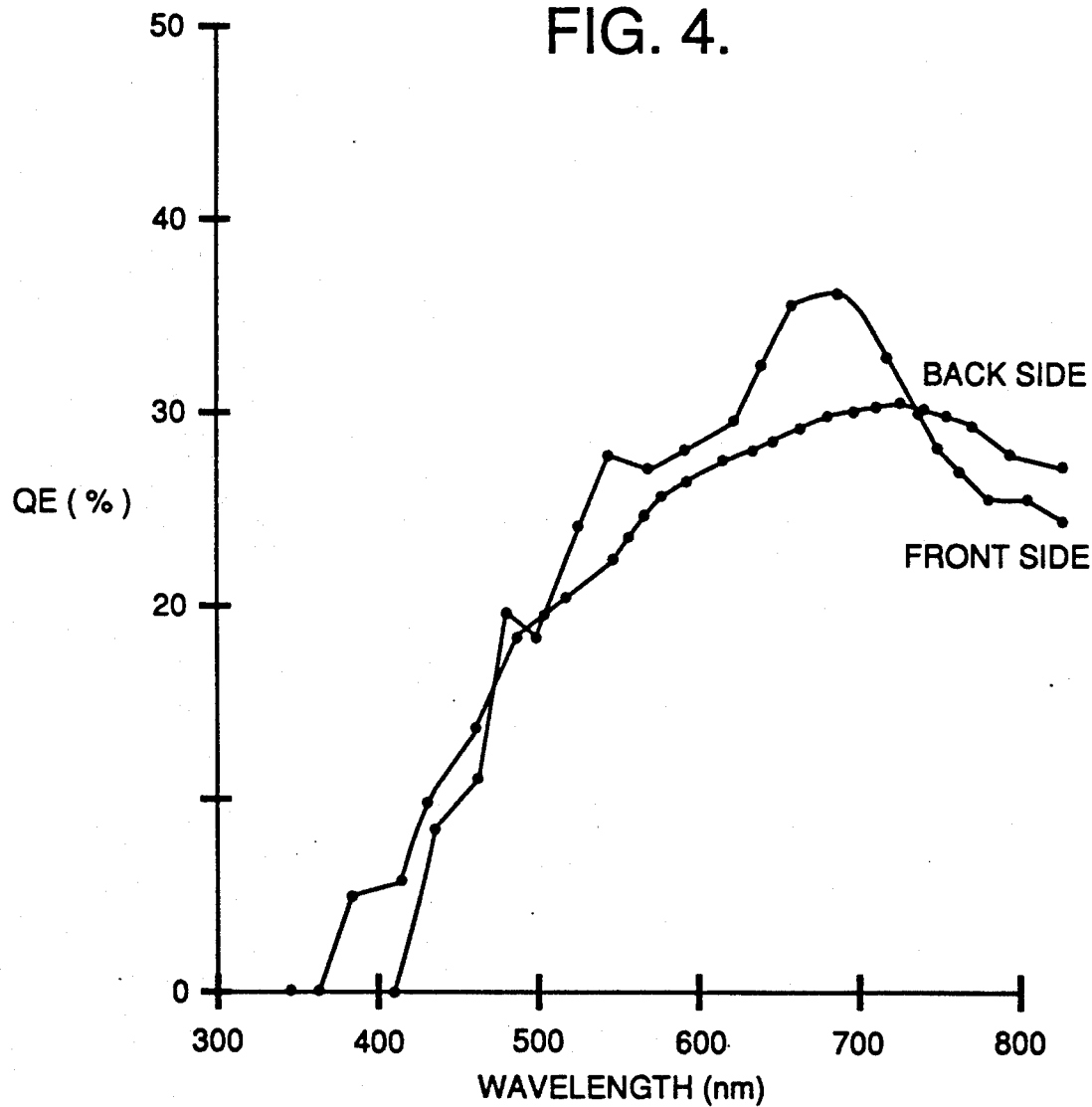
FIG. 4 is a graph illustrating the measured quantum efficiency of both front and back sides of a prototype two-sided imaging device.

A device constructed in the afore-mentioned manner has substantially similar quantum efficiency characteristics for both the front and rear surfaces, an essential feature for the practice of the present invention. Referring to FIG. 4, there is shown the quantum efficiency for the both the front and back surfaces at different wavelengths of a prototype device constructed in accordance with the present invention.

Figure 5:
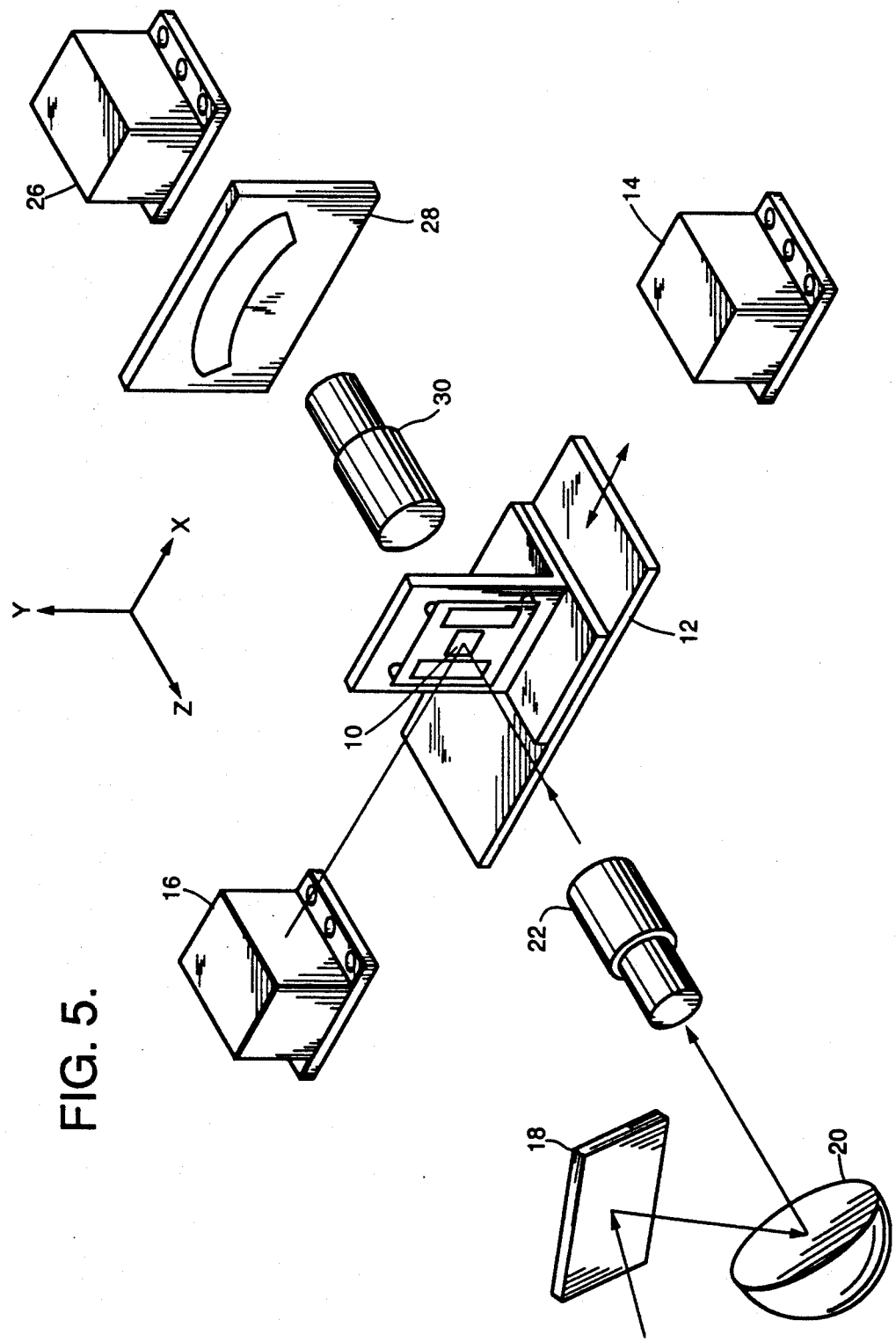
FIG. 5 is a schematic illustration of the improved terrestrial guidance system of the present invention.

Using the imaging device of the present invention, a guidance system may be more simply constructed, as shown in FIG. 5. In FIG. 5, many of the elements are identical to those of FIG. 2; however, one critical element has been eliminated, that being the beam combiner 24, a source of considerable photon loss. In FIG. 5, the grid plate 28 is imaged onto the back surface of the imaging device, and the guide star field onto the front surface. It is evident that the beam combiner has been eliminated and that the overall optical paths have been shortened, resulting in a simpler, more robust, more efficient and more compact system.

Using the unique two-sided imager of the present invention, the guidance system is more capable of detecting and utilizing photons from more remote and less bright guide stars to provide more accurate vehicle orientation. The system has illustrated the usefulness of a two-sided imaging device which may be useful in many other potential applications.

While the invention has been described using a silicon body, it should be apparent that other materials could very well be used. As for example, infra-red detection materials such as mercury-cadmium-telluride could be used. The thickness of the body will depend upon the particular material used and need not be 10 um as described in the application.

What is claimed is:

1. A two-sided charge-coupled imaging device, comprising:
    a planar body of crystalline material of the type having covalently bonded atoms, said body having front and back surfaces for receiving illumination;
    a charge-coupled gate array configuration formed on said front surface;
    means for providing electrical output signals from said device; and
    a package in which said body is mounted, said package having front and rear openings, whereby said device can receive illumination on both the front and back surfaces.

2. A two-sided imaging device as described in claim 1, wherein said front and back surfaces have an optical quality finish.

3. A two-sided imaging device as described in claim 1, wherein the body is silicon and has a thickness of approximately 10 um.

4. A two-sided imaging device as described in claim 1, additionally comprising a dopant concentration formed in said body at the back surface for establishing an electrical field for driving free electrons toward the front surface.

5. A two-sided imaging device as described in claim 4, wherein the body is silicon and the dopant comprises atoms of boron.

6. A two-sided imaging device as described in claim 5, wherein the boron concentration lies in a range of $1 \times 10^{19} - 1 \times 10^{20}$ boron atoms per cubic centimeter.

* * * * *